Dec. 11, 1962 M. WEINBERG 3,068,427

FREQUENCY MODULATOR INCLUDING VOLTAGE SENSITIVE CAPACITORS FOR CHANGING THE EFFECTIVE CAPACITANCE AND INDUCTANCE OF AN OSCILLATOR CIRCUIT

Filed Feb. 11, 1960

INVENTOR.
MORTON WEINBERG
BY Mueller & Aichele
Attys.

3,068,427
Patented Dec. 11, 1962

3,068,427

FREQUENCY MODULATOR INCLUDING VOLTAGE SENSITIVE CAPACITORS FOR CHANGING THE EFFECTIVE CAPACITANCE AND INDUCTANCE OF AN OSCILLATOR CIRCUIT

Morton Weinberg, Des Plaines, Ill., assignor to Motorola, Inc., Chicago, Ill., a corporation of Illinois Filed Feb. 11, 1960, Ser. No. 8,027
10 Claims. (Cl. 332—30)

This invention relates generally to frequency modulation systems and in particular to varying the frequency of a crystal controlled oscillator circuit in accordance with a modulating signal through the utilization of back-biased variable capacitance semiconductor devices.

In frequency modulation transmitters, as in other radio transmitters, it is necessary to exercise precise control of the frequency transmitted. It has been customary to use, for frequency stability purposes, crystal controlled oscillators which provide a high degree of frequency stability even when there are wide changes in ambient temperature and supply voltage. Because crystals provide close control of the frequency transmitted, in frequency modulation transmitters the problem of obtaining the required deviation for frequency modulation has been acute. Usually it has been necessary to use various circuitry to achieve phase modulation and then utilize phase shifting devices and corrective networks to convert phase modulation to frequency modulation. Although circuits have been provided for achieving frequency modulation with crystal controlled oscillators these circuits have been complicated and have had the disadvantage of being unstable and have not provided the required frequency deviation.

Thus, it is an object of the present invention to provide an improved crystal controlled oscillator circuit the frequency of which can be varied directly by applying a modulating signal thereto.

Another object of the invention is to provide a simple and inexpensive crystal oscillator circuit which allows maximum frequency deviation while maintaining minimum distortion of the output signal.

A further object of the invention is to provide a crystal oscillator having a frequency controlling resonant circuit which may be modulated by variation of a reactance element in the circuit which provides stable operation over a wide range of variations.

A feature of the invention is the provision of a crystal oscillator circuit utilizing a single transistor and a variable resonant feedback circuit for modulating the frequency produced thereby.

A further feature of the invention is the provision of an oscillator circuit utilizing a piezoelectric crystal in series with a series resonant circuit controlled by the capacitance variations of two voltage sensitive semiconductor devices. One of the devices may form the capacitance of a series resonant circuit and the other device may cooperate with an inductor to form the inductance of the series resonant circuit.

Another feature of the invention is the provision of a series resonant circuit the frequency of which is controlled by back-bias voltage applied to variable-capacitance semiconductor diodes in the series resonant circuit. The series resonant circuit may be used as the frequency controlling circuit of an oscillator.

In practicing the invention there is provided an electron oscillator circuit including a quartz crystal operating in a series resonant mode in the feedback circuit. A transistor is used as the electron amplifying device in the circuit. The quartz crystal is shunted by a neutralizing coil, and is connected in series with a series resonant circuit between the collector and emitter electrodes of the transistor. The resonant circuit includes a first voltage sensitive semiconductor diode serving as a capacitor connected in series with an inductor which is shunted by a second voltage sensitive semiconductor diode. The first device forms a variable capacitor and the second diode varies the inductance of the inductor and diode combination. Each voltage sensitive diode may be shunted by a temperature compensating capacitor, and a linearity coil may be connected across the entire resonant circuit. A regulated bias voltage is applied to the junction of the two diodes, and an audio frequency modulating voltage is superimposed on the bias voltage to change the capacitance of the diodes, and thereby change the oscillator frequency. Thus, when the capacitance of the diodes is increased by a signal which opposes the bias, the net effect in the feedback circuit is an increase in inductive reactance thereby causing a decrease in the oscillator frequency. The two diodes are controlled by the same modulating voltage and the increased capacitance thereof for example, decreases the capacitive reactance of the series semiconductor diode and increases the net inductive reactance of the parallel combination of inductor and semiconductor diode thus multiplying the effect of a change in capacitance to a large change in reactive impedance.

Figure 1:
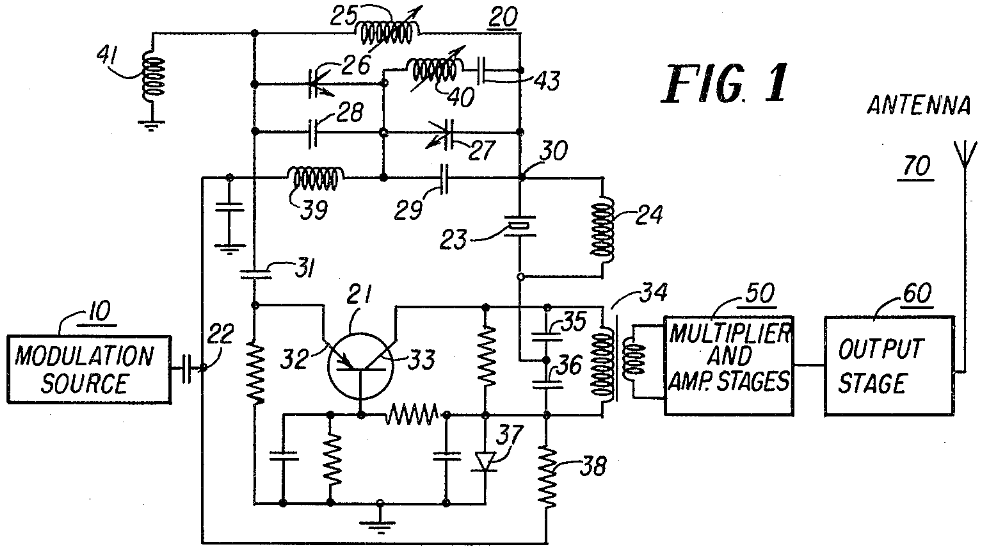
FIG. 1 is a partial block diagram of a typical transmitter with the oscillator circuit of the invention shown in a schematic diagram.

Referring now to the drawings, in FIG. 1 there is illustrated a transmitter circuit including a modulation source 10, an oscillator circuit 20, multiplier and amplifier stages 50, output stage 60, and antenna 70. Oscillator circuit 20 includes a transistor 21 used as the primary electron discharge device which provides gain for sustaining oscillation. Crystal 23 has choke 24 shunted therewith for neutralization. Collector 33 of transistor 21 is coupled to output transformer 34 which is tuned by capacitors 35 and 36 connected in series and shunted across the primary winding thereof.

The frequency controlling circuit of the oscillator includes capacitive diode 26 in series with coil 40 across which capacitive diode 27 is shunted, and all of which is shunted by coil 25. Capacitor 43 connected in series with coil 40 serves as a blocking capacitor. Coil 25 is variable to change the frequency versus bias variation characteristic of the modulator. Capacitors 28 and 29 are fixed capacitors shunted across capacitive diodes 26 and 27 to provide temperature compensation and reduce reactance change with voltage, when less than maximum deviation is desired. Coil 40 may be tunable and may be used to warp the oscillator to the desired operating frequency. The resonant or frequency controlling circuit is connected at 30 to the crystal-choke and together therewith forms the feedback circuit for the oscillator. This is connected from the output circuit, between capacitors 35 and 36, through capacitor 31 to emitter 32 of transistor 21.

The collector voltage supply is regulated by regulator diode 37. This voltage is also used as the basis on the variable capacitance diodes 26 and 27 which control the frequency of the oscillator. This bias is fed to the junction of variable capacitive diodes 26 and 27 through resistor 38 and choke 39. Signals from modulation source 10 are also applied through choke 39 to the junction of diodes 26 and 27. Resistor 38 forms the audio load and may be selected so that the audio is not substantially loaded. Choke 41 is used as a D.C. return to ground for the diode bias.

As the modulation source voltage is superimposed on the bias voltage, diodes 26 and 27 vary in capacitance to change the tuning of the resonant circuit, and the oscillator output frequency follows these changes. This may appear more clearly from a consideration of FIG. 2. As the negative voltage across diode 26 increases, the capacitance thereof decreases and the capacitive reactance increases. At the same time the increase in negative voltage across diode 27 will decrease its capacitance and increase its capacitive reactance. This will decrease the effective inductance of diode 27 and coil 40 in parallel. The variations in capacitance and inductance will have additive effects to greatly increase the oscillator frequency. When the capacitance of diodes 26 and 27 is increased by applying less bias, the net effect in the feedback circuit is an increase in inductive reactance and decrease in capacitive reactance causing a decrease in oscillator frequency. The inductive reactance of coil 40 must always be less than the capacitive reactance of the diode 27 to sustain operation of the series resonant circuit. Oscillator circuit 20 includes a transistor 21 used as the primary electron discharge device which provides gain for sustaining oscillations.

The capacitance of all semiconductor diodes is essentially proportional to the reciprocal of the square or cube root of the applied back-bias voltage. In the circuit, care must be taken to prevent the sum of the bias voltage, audio peak voltage from the modulation source, and radio frequency peak voltage across the diode from becoming positive in value thereby causing the diode to conduct. Since diodes 26 and 27 are operated at all times with back-bias, the impedance of the modulator is very high (since it is determined almost entirely by the value of resistor 38) and the audio amplifier used to drive the modulator need not supply a great amount of power.

It is to be pointed out that the bias and modulating signals are applied to the junction of the back to back diodes so that the full bias and modulating voltage is applied across each. This causes maximum capacity variations from a given modulating signal. As one diode is also connected in parallel with an inductance the change in capacitance is multiplied giving a much larger change in reactance than would occur by simply connecting one diode in series with an inductance. This results in a large frequency variation of the oscillator from a given level of modulation signals.

The diodes 26 and 27 need not be equal but must have values which provide resonance at a normal bias position. It may be desired to use a diode 27 having a greater capacitance than diode 26 to provide a greater change in net series reactance with modulating voltage.

Figure 3:
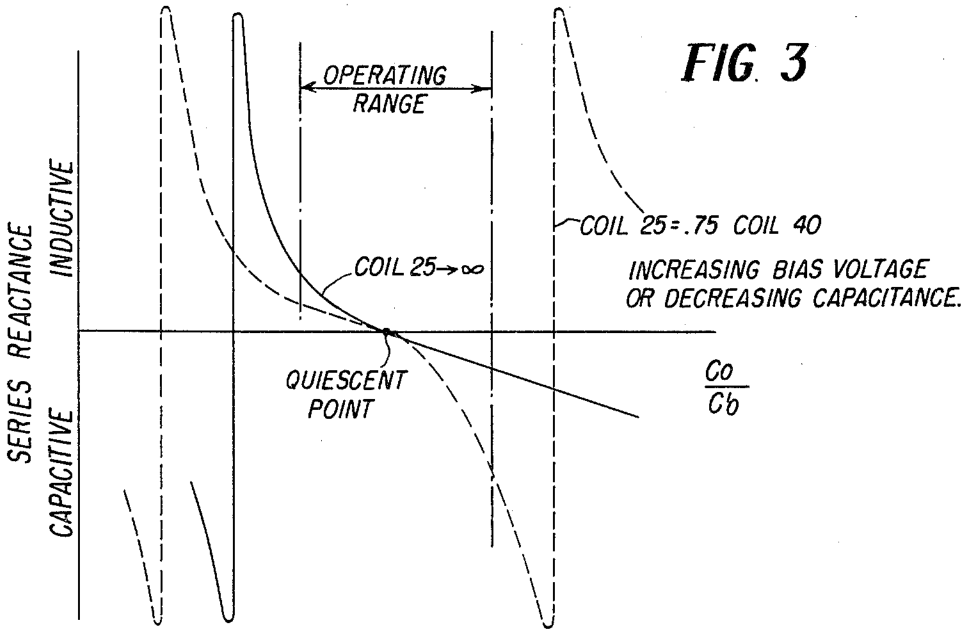
FIG. 3 shows net impedance plotted against increasing bias voltage or decreasing capacitance in the equivalent circuit of FIG. 2.
Figure 2:
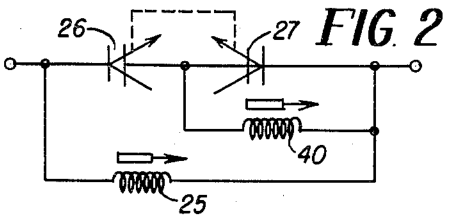
FIG. 2 shows a simplified equivalent circuit used to explain the operation of the oscillator circuit.

FIG. 3 shows the net series reactance of the network in FIG. 2 as a function of the ratio of the initial diode capacitance at quiescent voltage to the capacitance at a new voltage at a fixed frequency. Going to the right on the abscissa is in the direction of increasing bias or negative voltage or decreasing capacitance. The upper ordinate is inductive reactance and the lower ordinate is capacitive reactance. The operating range is shown equidistant from either side of the quiescent point where $Co/C'o=1$. $Co$ is the capacitance of diodes 26 and 27 at the quiescent or non-modulated bias voltage. $C'o$ is the capacitance of diodes 26 and 27 at any voltage within the range of the curves shown. At the quiescent point $C'o$ is equal to $Co$ and the reactance is zero. When the back bias voltage is increased, $C'o$ is less than $Co$ and the circuit becomes capacitive. When $C'o$ is greater than $Co$ or the bias voltage is approaching zero, the circuit becomes inductive.

The solid curve of FIG. 3 was plotted for a very large value of inductance in coil 25. The dotted curve of FIG. 3 was plotted when the value of coil 25 was seventy-five percent of the value of coil 40. By combining the circuit with a proper choice of components, a frequency modulator results which has good linearity over the entire operating range. The operating range will be determined by the distance the varying bias can warp the crystal along the frequency axis between the two anti-resonant points and the range over which the impedance versus freqency curve for the crystal modulating circuit compensate each other to produce a linear change in frequency for a change in bias voltage.

Thus, the invention provides for an oscillator circuit which utilizes a transistor and variable capacitive diodes to vary the frequency of a crystal and thereby permit direct frequency modulation of a transmitter. The circuit has been found to be highly stable and provides a relatively large variation in frequency from a modulation signal of a given level.

I claim:

1. An electronic oscillator circuit including in combination, a transistor having emitter and collector electrodes, a feedback circuit connected between said emitter and collector electrodes and cooperating with said transistor to form an oscillator, said feedback circuit including a piezoelectric crystal unit series resonant at a predetermined frequency and a series resonant circuit connected in series with said crystal unit, said series resonant circuit including a first voltage sensitive capacitor and an inductor connected in series, a second voltage sensitive capacitor shunted across said inductor, bias voltage means applying a regulated bias voltage to said voltage sensitive capacitors, input signal means applying a varying input signal voltage smaller than said bias voltage to said voltage sensitive capacitors thereby forming a composite signal voltage, variations in said composite signal voltage causing variations in the capacitance of said voltage sensitive capacitors, to thereby change the tuning of said series resonant circuit, said first capacitor producing a change in the capacitive reactance and said second capacitor and said inductor in parallel providing an opposing change in the inductive reactance for an additive effect, the frequency of said series resonant circuit varying from said predetermined frequency in response to the input signal voltage applied to said voltage sensitive capacitors, and the frequency of oscillations being determined substantially entirely by said feedback circuit.

2. An electronic oscillator circuit including in combination, a transistor having emitter and collector electrodes, a feedback circuit connected between said emitter and collector electrodes and cooperating with said transistor to form an oscillator, said feedback circuit including a piezo-electric crystal unit series resonant at a predetermined frequency and a series resonant circuit shunted by a first inductor and connected in series with said crystal unit, said series resonant circuit including a second inductor and fixed capacitor connected in series, first and second voltage sensitive capacitors connected in series with each other, each of said voltage sensitive capacitors being shunted by a temperature compensating capacitor, said first voltage sensitive capacitor being shunted across said second inductor and said fixed capacitor, said second voltage sensitive capacitor being connected in series with said second inductor and said fixed capacitor in said series resonant circuit, bias voltage means applying regulated bias voltage to said voltage sensitive capacitors, input signal means applying a varying input signal voltage smaller than said bias voltage to said voltage sensitive capacitors thereby causing variation in the capacitance thereof, the frequency of oscillation being determined substantially entirely by said feedback circuit whereby the frequency of said oscillator circuit varies from said predetermined frequency substantially linearly with input signal voltage applied to said voltage sensitive capacitors.

3. An electronic oscillator circuit including in combination a transistor having emitter and collector electrodes, a feedback circuit connected between said emitter and collector electrodes and cooperating with said transistor to form an oscillator, said feedback circuit including a crystal unit series resonant at a predetermined frequency and a series resonant circuit shunted by a first inductor and connected in series with said crystal unit, said series resonant circuit including a second inductor, and first and second voltage sensitive diodes connected in series and for backward conduction with respect to each other, said diodes having capacitance which varies with the voltage applied thereacross in the direction opposite to the direction which causes conduction, said first voltage sensitive diode being connected in parallel with said second inductor, said second voltage sensitive diode being connected in series with said second inductor in said series resonant circuit, bias voltage means connected to the junction of said first and second voltage sensitive diodes and applying a regulated fixed bias voltage thereto in said opposite direction, input signal means applying a varying input signal voltage smaller than said bias voltage to said voltage sensitive diodes thereby forming a composite signal voltage, variations in said composite signal voltage thereby causing variations in the capacitance thereof of said voltage sensitive diodes, said composite signal voltage having a maximum excursion of such nature that said voltage sensitive diodes remain nonconductive, said first diode producing a change in the capacitive reactance and said second diode in parallel with said second inductor producing an opposing change in the inductive reactance which is additive in effect to said capacitive reactance change, the frequency of oscillation being determined substantially entirely by said feedback circuit whereby the frequency of said oscillator circuit varies from said predetermined frequency in response to input signal voltage applied to said voltage sensitive diodes.

4. An electronic oscillator circuit including in combination, a transistor having emitter and collector electrodes, a feedback circuit connected between said emitter and collector electrodes and cooperating with said transistor to form an oscillator, said feedback circuit including a piezo-electric crystal unit series resonant at a predetermined frequency and a series resonant circuit shunted by first inductor means and connected in series with said crystal unit, said series resonant circuit including second inductor means, first and second fixed capacitor means, and first and second voltage sensitive capacitor means, said first fixed capacitor means and said first voltage sensitive capacitor means being connected in parallel with each other and in series with said second inductor means in said series resonant circuit, said second fixed capacitor means and said second voltage sensitive capacitor means being connected in parallel with said second inductor means, bias voltage means including a circuit having resistance and inductance applying a regulated fixed bias voltage to said voltage sensitive capacitor means, input signal means applying a varying input signal voltage smaller than said fixed bias voltage to said voltage sensitive capacitor means thereby causing variations in capacitance thereof said first voltage sensitive capacitor means producing a change in the capacitive reactance which cooperates with an opposing change in the inductive reactance produced by said second voltage sensitive capacitor means in parallel with said second inductor means, the frequency of oscillations being determined substantially entirely by said feedback circuit whereby the frequency of said oscillator circuit varies from said predetermined frequency in response to input signal voltage applied to said first and second voltage sensitive capacitor means.

5. An electronic oscillator circuit including in combination, a transistor having emitter and collector electrodes, a feedback circuit connected between said emitter and collector electrodes and cooperating with said transistor to form an oscillator, said feedback circuit including a piezo-electric crystal unit series resonant at a predetermined frequency, a series resonant circuit shunted by first inductor means and connected in series with said crystal unit, said series resonant circuit including second inductor means, first and second voltage sensitive semiconductor diodes connected in series and for backward conduction with respect to each other, said diodes having a capacitance which varies with the voltage applied thereacross in the direction opposite to the direction which causes conduction, said first voltage sensitive semiconductor diode being connected in parallel across said second inductor means, said second voltage sensitive semiconductor diode being connected in series with said second inductor means in said series resonant circuit, bias voltage means connected to the junction of said first and second semiconductor diodes for applying a regulated fixed bias voltage thereto in said opposite direction, modulating signal means applying a varying input voltage smaller than said bias voltage to said junction of said voltage sensitive diodes thereby forming a composite signal voltage, variations in said composite signal voltage thereby causing variations in the capacitance of said voltage sensitive diodes, said composite signal voltage having a maximum excursion of such nature that said voltage sensitive diodes remain non-conductive, said composite signal voltage being effectively applied to said diodes in parallel whereby overall modulation is linear with respect to applied voltage, said first semiconductor diode producing a change in the capacitive reactance aided by an opposing change in the inductive reactance caused by said second semiconductor diode in parallel with said second inductor means, the frequency of oscillation being determined substantially entirely by said feedback circuit whereby the frequency of said oscillator circuit varies from said predetermined frequency substantially linearly with said modulating signal applied to said voltage sensitive diodes.

6. An electronic oscillator circuit including in combination a transistor having emitter and collector electrodes, a feedback circuit connected between said emitter and collector electrodes and cooperating with said transistor to form an oscillator, said feedback circuit including a crystal unit series resonant at a predetermined frequency and a series resonant circuit having first inductor means for maintaining frequency linearity shunted thereacross connected in series with said crystal unit, said series resonant circuit including second inductor means, a fixed capacitance connected in series between said crystal unit and said second inductor means, first and second temperature compensating capacitors connected in series, and first and second voltage sensitive diodes connected in series and for backward conduction with respect to each other, said diodes having capacitance which varies with the voltage applied thereacross in the direction opposite to the direction which causes conduction, said voltage sensitive diodes and said first and second temperature sensitive capacitors being connected in parallel with said first inductor means, said second diode having said second inductor means and said fixed capacitance shunted thereacross and connected at one end to said crystal unit, bias voltage means including a regulator diode and a resistor and a choke connected in series to the junction of said first and second voltage sensitive diodes and applying a regulated bias voltage thereto in said opposite direction, a direct current return to ground being provided through a choke connected to the conducting end of said first diode, input signal means applying an input signal voltage smaller than said bias voltage to said junction of said voltage sensitive diodes thereby causing variation in the capacitance thereof, the frequency of oscillation being determined substantially entirely by said feedback circuit whereby the frequency of said oscillator circuit varies from said predetermined frequency in response to input signal voltage applied to said voltage sensitive diodes.

7. An electronic oscillator circuit including in combination a transistor having emitter and collector electrodes, a feedback circuit connected between said emitter and collector electrodes and cooperating with said transistor to form an oscillator, said feedback circuit including a crystal unit series resonant at a predetermined frequency, a series resonant circuit connected in series with said crystal unit, and first inductor means having first and second ends shunted across said series resonant circuit for frequency linearity, said crystal unit including a piezo-electric crystal shunted with a coil, said series resonant circuit including second inductor means connected to said crystal unit, first and second temperature compensating capacitors connected in series, and first and second voltage sensitive diodes connected in series and for backward conduction with respect to each other, said diodes having capacitance which varies with the voltage applied thereacross in the direction opposite to the direction which causes conduction, said voltage sensitive diodes and said first and second temperature compensating capacitors being connected in parallel with said first inductor means, said second diode having said second inductor means series connected with a capacitor and shunted thereacross, one end being connected to said crystal unit, bias voltage means including a regulator diode and a resistor and a choke connected in series to the junction of said first and second voltage sensitive diodes and applying a regulated bias voltage thereto in said opposite direction, a direct current return to ground being provided through a choke connected to the conducting end of said second diode, input signal means applying an input signal voltage smaller than said bias voltage to said junction of said voltage sensitive diodes thereby causing variation in the capacitance thereof, the frequency of oscillation being determined substantially entirely by said feedback circuit whereby the frequency of said oscillator circuit varies from said predetermined frequency in response to input signal voltage applied to said voltage sensitive diodes.

8. In the feedback circuit of an electronic oscillator having a crystal unit series resonant at a predetermined frequency, a series resonant circuit connected to said crystal unit including first and second voltage sensitive semiconductor diodes connected in series and poled for backward conduction with respect to each other, and an inductor shunting one of said diodes, said diodes having a capacitance which varies with a modulation voltage applied thereacross in the direction opposite to the direction which causes conduction, said modulating voltage having a maximum excursion of such nature that said voltage sensitive semiconductor diodes remain non-conductive, said first diode producing a change in the capacitive reactance aided by an opposing change in the inductive reactance caused by said second diode in parallel with said inductor, the frequency of oscillation of said oscillator circuit being determined substantially entirely by said feedback circuit whereby the frequency varies from said predetermined frequency in a substantially linear relationship with said modulation voltage applied to said voltage sensitive diodes.

9. A series resonant circuit including first and second voltage sensitive semiconductor diodes connected in series and for backward conduction with respect to each other, said diodes in the non-conductive state having a capacitance which varies with the voltage applied thereto in a direction opposite to the direction providing conduction, an inductor shunting said second diode and forming therewith a net inductance which resonates with the capacitance of said first diode, and means for applying a voltage to said diodes to vary the capacitance thereof, said first diode producing a change in the capacitive reactance and said second diode in parallel with said inductor producing an opposing change in the inductive reactance which is additive in effect to said capacitive reactance change and thereby vary the tuning of said resonant circuit.

10. A series resonant circuit including a first voltage sensitive semiconductor diode, an inductor connected in series with said diode and a second voltage sensitive diode connected in shunt across said inductor, said first and second diodes being connected for backward conduction with respect to each other and having capacitance values in the non-conductive state which vary in response to a voltage applied thereto in the direction opposite to the direction of conduction thereof, the resonant frequency of said series resonant circuit being controlled by a modulating voltage applied to said voltage sensitive diodes, said first diode producing a change in capacitive reactance which is additive in effect to an opposing change in inductive reactance caused by said second diode in parallel with said inductor.

References Cited in the file of this patent

UNITED STATES PATENTS

| | | |
|---|---|---|
| 2,925,561 | MacDonald | Feb. 16, 1960 |
| 2,925,563 | Firestone | Feb. 16, 1960 |

OTHER REFERENCES

Voltage Variable Capacitors—State of the Art, by MacMahon et al., Electronic Industries, December 1959, pages 90–93.